(12) United States Patent
Lin et al.

(10) Patent No.: US 10,213,986 B2
(45) Date of Patent: Feb. 26, 2019

(54) ELECTRIC CONNECTION AND METHOD OF MANUFACTURING THE SAME

(71) Applicant: NATIONAL CHENG KUNG UNIVERSITY, Tainan (TW)

(72) Inventors: Shih-Kang Lin, Tainan (TW);
Hao-Miao Chang, Tainan (TW);
Mei-Jun Wang, Tainan (TW);
Cheng-Liang Cho, Tainan (TW);
Che-Yu Yeh, Tainan (TW)

(73) Assignee: National Cheng Kung University (TW)

( * ) Notice: Subject to any disclaimer, the term of this patent is extended or adjusted under 35 U.S.C. 154(b) by 199 days.

(21) Appl. No.: 14/930,768

(22) Filed: Nov. 3, 2015

(65) Prior Publication Data

US 2016/0121582 A1    May 5, 2016

(30) Foreign Application Priority Data

Nov. 3, 2014 (TW) .............................. 103138070 A

(51) Int. Cl.
*B32B 15/01* (2006.01)
*H01B 1/02* (2006.01)
(Continued)

(52) U.S. Cl.
CPC ............ *B32B 15/01* (2013.01); *H01B 1/026* (2013.01); *C22C 19/00* (2013.01); *C22C 19/002* (2013.01); *C22C 19/03* (2013.01); *H01L 23/481* (2013.01); *H01L 23/4827* (2013.01); *Y10T 428/1291* (2015.01); *Y10T 428/12903* (2015.01); *Y10T 428/12944* (2015.01)

(58) Field of Classification Search
None
See application file for complete search history.

(56) References Cited

U.S. PATENT DOCUMENTS 4,785,137 A * 11/1988 Samuels ................. C22C 19/03
174/255
5,519,192 A * 5/1996 Childs .................... B23K 1/002
219/605

(Continued)

FOREIGN PATENT DOCUMENTS

JP          H01220840 A    9/1989
JP          2001501256 A   1/2001
(Continued)

*Primary Examiner* — Seth Dumbris
(74) *Attorney, Agent, or Firm* — Emerson, Thomson & Bennett, LLC; Roger D. Emerson

(57) ABSTRACT

An electric connection is provided, and has a first copper (Cu) layer, a second Cu layer, and a composite metal layer disposed between the first Cu layer and the second Cu layer. The composite metal layer has 0.01 wt. %≤gallium (Ga)≤20 wt. %, 0.01 wt. %≤copper (Cu)≤50 wt. %, and 30 wt. %≤nickel (Ni)≤99.98 wt. %. Moreover, a method of manufacturing the electric connection is provided, and has the steps of: (1) providing a first Cu layer and a second Cu layer; (2) forming a first Ni layer on the first Cu layer; (3) forming a second Ni layer on the second Cu layer; (4) forming a Ga layer on the first Ni layer; and (5) keeping the second Ni layer in contact with the Ga layer and carrying out a thermo-compress bonding therebetween to form the electric connection.

2 Claims, 3 Drawing Sheets

(51) Int. Cl.
    *C22C 19/00*     (2006.01)
    *H01L 23/482*     (2006.01)
    *H01L 23/48*     (2006.01)
    *C22C 19/03*     (2006.01)

(56) References Cited

U.S. PATENT DOCUMENTS

| | | | |
|---|---|---|---|
| 5,964,966 A | * | 10/1999 | Goyal ............ C22C 19/03 |
| | | | 148/426 |
| 6,375,766 B1 | | 4/2002 | Czech |
| 8,507,376 B2 | | 8/2013 | Ewert et al. |
| 2002/0066524 A1 | | 6/2002 | Kagawa et al. |
| 2009/0235983 A1 | | 9/2009 | Girt et al. |
| 2012/0003468 A1 | | 1/2012 | Husemann et al. |

FOREIGN PATENT DOCUMENTS

| | | |
|---|---|---|
| JP | 2011166066 A | 8/2011 |
| JP | 2012506628 A | 3/2012 |
| TW | 201022396 A | 6/2010 |
| WO | 9814625 A1 | 4/1998 |

\* cited by examiner

ELECTRIC CONNECTION AND METHOD OF MANUFACTURING THE SAME

CROSS REFERENCE TO RELATED APPLICATIONS

This application claims the benefit of priority of Taiwan Patent Application No. 103138070, filed on Nov. 3, 2014, the disclosure of which is incorporated herein by reference.

FIELD OF THE INVENTION

The present invention relates to an electric connection and a method of manufacturing the electric connection, and in particular relates to a copper-to-copper (Cu-to-Cu) electric connection.

BACKGROUND OF THE INVENTION

In recent years, the development trend of electronic semiconductors, miniaturization, high efficiency, low consumption and low cost are continuously pursued. Through Silicon Via (TSV) is to drill a via on a wafer or a chip by a laser, and then to fill the hole with a conductive material to form a conductive path, thereby vertically connecting the upper and lower surfaces of the wafer, enabling the stacking multiple chips. This technique is called a three-dimensional integrated circuit (3D IC) package. Compared with the conventional multi-chip package, a three-dimensional package can shorten the signal transmission path by staking a plurality of chips, so that the signal is transmitted more quickly, and the space occupied by the package is also reduced. These advantages have allowed 3D IC to become a competing technology for the semiconductor manufacturers, and to become a key to maintaining competitiveness in integrated circuit production and the packaging/testing industry.

Taiwan semiconductor manufacturers, such as TSMC, ASE, SPIL, POWERTECH, etc., have all actively built 2.5D and 3D IC packaging and testing capacity in recent years. In addition, other semiconductor manufacturers, such as Samsung, Elpida, and Intel have similarly put resources into the research and production of 3D IC. 3D IC products are expected to become mainstream electronic goods in the next generation.

In 3D IC packaging technologies, silicon chips are stacked and connected vertically, which can significantly reduce the size of component, enhance efficiency, reduce energy consumption, and improve functionality. The TSV interconnection is a core technology in 3D IC, its critical processes involve wafer thinning, TSV formation, and Cu-to-Cu connections. The Cu-to-Cu connection can be achieved by direct diffusion bonding or micro-bump bonding. The former does not need any foreign filler material, so pure Cu contacts can be formed. However, a high processing temperature (usually requiring 300° C. or higher) and a large processing pressure (25 bars or more) must be provided to drive the diffusion of Cu atoms. In addition, pretreatment processes upon the surface of Cu substrates are often required to activate the bonding surfaces. These complex procedures and precautions make the direct diffusion bonding a relatively costly and complicated process. In addition, the required high pressure is not only costly, but may cause damages to the electronic components on the wafer. On the other hand, micro-bump bonding involves soldering process, i.e., molten solders wet the substrates and solidified, to form electronic interconnections, and therefore does not require the pre-treatments and the high processing pressure. However, solders are commonly composed of tin (Sn), which can readily react with the Cu metal as the substrates to produce a large fraction of brittle and electrical resistant intermetallic compound (IMC) formation in the contacts, thereby significantly reducing the reliability of the contacts.

It is therefore necessary to provide an electric connection and a method of manufacturing the electric connection for providing a Cu-to-Cu connection with high reliability, in order to solve the problems existing in the conventional technology as described above.

SUMMARY OF THE INVENTION

A primary objective of the present invention is to provide an electric connection with high ductility and thermal stability, and a method of manufacturing the electric connection. Conventional brittle IMC formation during soldering in the electric connection can be avoided by introducing gallium (Ga) and nickel (Ni) into a Cu-to-Cu connection, thereby solving the reliability concerns associated with IMC formation. In addition, as the Ga metal has a specific low melting point (29.7° C.) and high mobility at moderate temperatures, relatively low bonding temperatures and pressures are adequate for reliable Cu-to-Cu interconnection formation.

To achieve the above objective, the present invention provides an electric connection, comprising a first Cu layer; a second Cu layer; and a composite metal layer disposed between the first Cu layer and the second Cu layer, wherein the composite metal layer comprises 0.01 wt. %≤Ga≤20 wt. %, 0.01 wt. %≤Cu≤50 wt. %, and 30 wt. %≤Ni≤99.98 wt. %.

In one embodiment of the present invention, the composite metal layer has a face-centered cubic (FCC) crystal structure.

In one embodiment of the present invention, the composite metal layer comprises 0.01 wt. % to 10 wt. % of Ga, 0.01 wt. % to 10 wt. % of Cu, and 80 wt. % to 99.98 wt. % of Ni.

Furthermore, the present invention provides a method of manufacturing an electric connection, comprising steps of (1) providing a first Cu layer and a second Cu layer; (2) forming a first Ni layer on the first Cu layer; (3) forming a second Ni layer on the second Cu layer; (4) forming a Ga layer on the first Ni layer; and (5) contacting the second Ni layer with the Ga layer to perform a thermal pressing connection therebetween to form the above-mentioned electric connection.

In one embodiment of the present invention, before the step (2), the method further comprises a step of (1a) carrying out a surface treatment of the first Cu layer.

In one embodiment of the present invention, the surface treatment is to clean the first Cu layer by grinding or by using an acidic solution and a solvent.

In one embodiment of the present invention, before the step (3), the method further comprises a step of (1b) carrying out a surface treatment of the second Cu layer.

In one embodiment of the present invention, the surface treatment is to clean the second Cu layer by grinding or by using an acidic solution and a solvent.

In one embodiment of the present invention, the step (2) is to form the first Ni layer by an electroplating process or an evaporation deposition process.

In one embodiment of the present invention, the step (3) is to form the second Ni layer by an electroplating process or an evaporation deposition process.

In one embodiment of the present invention, the step (4) is to form the Ga layer by an electroplating process or an evaporation deposition process.

In one embodiment of the present invention, the step (5) is performed at a temperature ranged from 300 to 400° C. and a pressure ranged from 4 to 8 bars.

In one embodiment of the present invention, a thickness ratio of the first Ni layer, the second Ni layer, and the Ga layer is 0.5~20:0.5~20:0.01~5.

DETAILED DESCRIPTION OF THE PREFERRED EMBODIMENTS

The structure and the technical means adopted by the present invention to achieve the above and other objectives can be best understood by referring to the following detailed description of the preferred embodiments. In addition, directional terms described by the present invention, such as upper, lower, front, back, left, right, inner, outer, side, etc., are only directions by referring to the accompanying drawings, and thus the directional terms are used to describe and understand the present invention, but the present invention is not limited thereto. Furthermore, if there is no specific description in the invention, singular terms such as "a", "one", and "the" include the plural number. For example, "a compound" or "at least one compound" may include a plurality of compounds, and the mixtures thereof. If there is no specific description in the invention, the "%" means "weight percentage (wt. %)", and the numerical range (e.g. 10%~11% of A) contains the upper and lower limit (i.e. $10\% \leq A \leq 11\%$). If the lower limit is not defined in the range (e.g. less than, or below 0.2% of B), it means that the lower limit is 0 (i.e. $0\% \leq B \leq 0.2\%$). The proportion of "weight percent" of each component can be replaced by the proportion of "weight portion" thereof. The above-mentioned terms are used to describe and understand the present invention, but the present invention is not limited thereto.

Figure 1:
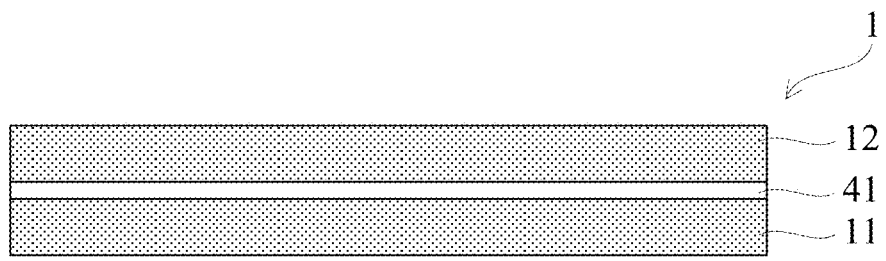
FIG. 1 is a schematic view of an electric connection according to one embodiment of the present invention.

Referring to FIG. 1, an electric connection 1 according to one embodiment of the present invention mainly comprises a first Cu layer 11, a second Cu layer 12, and a composite metal layer 41. The composite metal layer 41 is disposed between the first Cu layer 11 and the second Cu layer 12, and comprises 0.01 wt. % $\leq$ Ga $\leq$ 20 wt. %, 0.01 wt. % $\leq$ Cu $\leq$ 50 wt. %, and 30 wt. % $\leq$ Ni $\leq$ 99.98 wt. %. Preferably, the composite metal layer 41 comprises 0.01 wt. % to 10 wt. % of Ga, 0.01 wt. % to 10 wt. % of Cu, and 80 wt. % to 99.98 wt. % of Ni, such as 0.8 wt. % of Ga, 1.1 wt. % of Cu, and 98.1 wt % of Ni, but it is not limited thereto. Furthermore, the composite metal layer 41 has a face-centered cubic (FCC) crystal structure.

Referring to FIGS. 2a to 2d, a method of manufacturing an electric connection 1 according to one embodiment of the present invention mainly comprises steps of (S1) providing a first Cu layer 11 and a second Cu layer 12; (S2) forming a first Ni layer 21 on the first Cu layer 11; (S3) forming a second Ni layer 22 on the second Cu layer 12; (S4) forming a Ga layer 31 on the first Ni layer 21; and (S5) contacting the second Ni layer 22 with the Ga layer 31 to perform a thermal pressing connection there-between. The principle and the implementation details of each step in this embodiment of the present invention will be described in detail hereinafter.

Figure 2A:
FIGS. 2a to 2d are schematic views of a flow chart of a method of manufacturing an electric connection according to one embodiment of the present invention.
Figure 2A:

First, as shown in FIG. 2a, the method of manufacturing an electric connection 1 according to one embodiment of the present invention is to execute the step (S1): providing a first Cu layer 11 and a second Cu layer 12. The first Cu layer 11 and the second Cu layer 12 are for example the Cu pads in TSVs. By the electric connection between one copper pad and another copper pad, a 3D IC integration assembly can be achieved.

Figure 2B:
Figure 2B:

Next, referring to FIG. 2b, the method of manufacturing an electric connection 1 according to one embodiment of the present invention is to execute the step (S2): forming a first Ni layer 21 on the first Cu layer 11; and (S3): forming a second Ni layer 22 on the second Cu layer 12. Preferably, before the step (S2), the method can further comprise a step (S1a): carrying out a surface treatment of the first Cu layer 11. Similarly, before the step (S3), the method can further comprise a step (S1b): carrying out a surface treatment of the second Cu layer 12. In the step (S1a) or (S1b), the surface treatment is to clean the first Cu layer 11 or the second Cu layer 12 by grinding or by using an acidic solution and a solvent. The acidic solution is for example hydrochloric acid, nitric acid, or acetic acid, but it is not limited thereto. The solvent is for example acetone, methanol, or ethanol, but it is not limited thereto. In addition, the step (S2) is to form the first Ni layer 21 by an electroplating process or an evaporation deposition process. The step (S3) is to form the second Ni layer 22 by an electroplating process or an evaporation deposition process. Preferably, the first Ni layer 21 and the second Ni layer 22 are formed at the same time by the same method, i.e. electroplating or evaporation deposition, so as to simplify the production process. For example, when the first nickel layer 21 and the second nickel layer 22 are formed by electroplating. The electroplating solution is a standard Watts' Nickel Solution containing 300 g/L nickel sulfate hexahydrate ($NiSO_4 \cdot 6H_2O$), 45 g/L nickel(II) chloride hexahydrate ($NiCl_2 \cdot 6H_2O$), and 40 g/L boric acid ($H_3BO_3$), and the electroplating process is performed by using a pure Cu as a cathode at pH 3.8, a temperature of 50° C., and a current density of 2 $A/dm^2$.

Figure 2C:
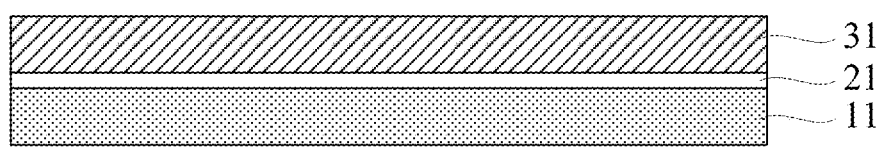

Next, referring to FIG. 2c, the method of manufacturing an electric connection 1 according to one embodiment of the present invention is to execute the step (S4): forming a Ga layer 31 on the first Ni layer 21. In this step, the Ga layer 31 is formed on the first Ni layer 21 by an electroplating process or an evaporation deposition process. For example, when the Ga layer 31 is formed by electroplating, a platinum electrode can be used as a counter electrode, a $Hg|Hg_2Cl_2$ (Saturated Calomel Electrode, SCE) can be used as a reference electrode, the electrolytic solution contains 0.25 M of Ga ions and 0.5 M sodium citrate with pH more than 10, the voltage is controlled with a current density of 10 $mA/cm^2$, and the electroplating process of the Ga layer is performed at room temperature.

Figure 2D:
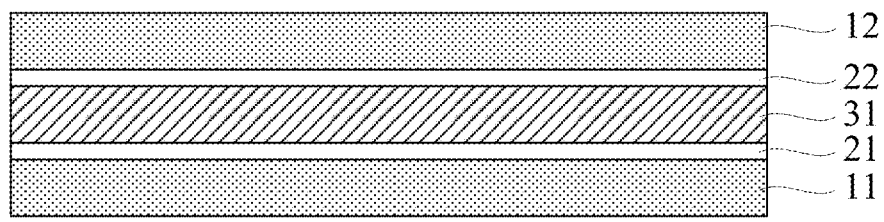

Next, referring to FIG. 2d, the method of manufacturing an electric connection 1 according to one embodiment of the present invention is to execute the step (S5): contacting the second Ni layer 22 with the Ga layer 31 to perform a thermal pressing connection between the second Ni layer 22 and the Ga layer 31. In this step, a temperature of the thermal pressing connection is 300-400° C., for example 300° C., but it is not limited thereto. A pressure of the thermal pressing connection is 4-8 bars. After the thermal pressing connection is finished, the electric connection 1 mentioned above can be formed.

Furthermore, in the method of manufacturing an electric connection 1 according to one embodiment of the present invention, a thickness ratio of the first Ni layer 21, the second Ni layer 22, and the Ga layer 31 is 0.5~20:0.5~20: 0.01~5. Preferably, the first Ni layer 21 has a thickness ranged from 0.5 to 20 microns ($\mu$m), such as 0.5, 5, 10, or 15 microns, but it is not limited thereto. Preferably, the second Ni layer 22 has a thickness ranged from 0.5 to 20 microns, such as 0.5, 5, 10, or 15 microns, but it is not limited thereto. Preferably, the Ga layer 31 has a thickness ranged from 0.01 to 5 microns ($\mu$m), such as 0.5, 1.5, 3, or 4.5 microns, but it is not limited thereto.

To make the electric connection and the method of manufacturing the electric connection provided by the present invention more definite, please refer to the experiment process described in the following.

First, a pure Cu substrate is prepared and grinded by using a silicon carbide papers and then polished with 1 $\mu$m alumina powders. Next, a pure Ni layer is coated on the Cu substrate by electroplating. The electroplating bath is formed of an acidic solution of nickel sulfate. Subsequently, a pure Ga metal is disposed between two pieces of Cu substrates with the Ni layer coated thereon, and then the sandwich structure is placed in a vacuum tube furnace to perform a thermal pressing connection for at least 30 minutes.

Figure 3:
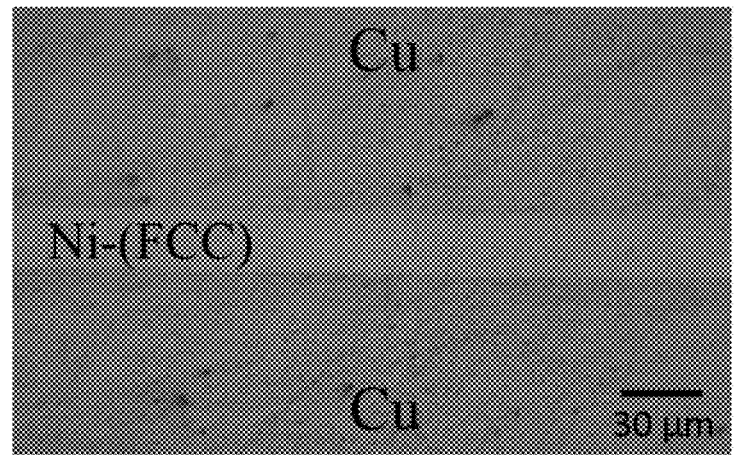
FIG. 3 is an image of an electric connection observed by a Metallographic Microscope according to one embodiment of the present invention.

When a 10 $\mu$m-thick Ni layer is coated, the structure as shown in FIG. 3 can be formed at 300° C. It can be seen from FIG. 3 that only an extensive Ni-rich solid solution phase with FCC crystal structure is formed between the two pieces of copper substrates. The reason for this result is that Ga and Cu both are soluble in the Ni-rich FCC phase (Ni-FCC).

Figure 4:
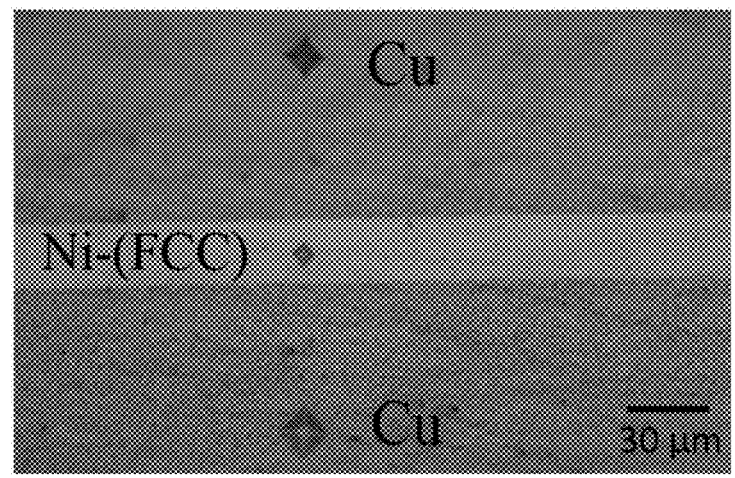
FIG. 4 is an image of an electric connection observed by a Metallographic Microscope after being analyzed by a Vickers Hardness Tester according to one embodiment of the present invention.

Furthermore, the mechanical properties of the above-mentioned structure are analyzed by a Vickers Hardness Tester, and the result is shown in FIG. 4. From FIG. 4, the notch on the Ni-FCC is smaller than that on the Cu substrates under 10 gf of load. In addition, average hardness values measured at different positions of the structure are respectively 2749.62 MPa in Ni-FCC and 715.62 MPa in Cu. Moreover, the same analyses is performed for pure Ni and its hardness is 2121.26 MPa. The result of the hardness tests shows that the electric connection according to the embodiment of the present invention has superior mechanical properties. Generally, in conventional solder joints, the tensile strength and the peel strength are decreased with growth of the interfacial IMCs. In this invention, while there is no IMC formation and only the solid solution phase with FCC crystal structure forms in the connection according to the embodiment, thus it is predictable that the mechanical properties of the FCC structure without IMC are better than that of any conventional connection structure with IMCs, and has better reliability. The above experiment and analysis results demonstrate that the electric connection and the manufacturing method thereof provided by the present invention can avoid the brittle IMC formation within the Cu-to-Cu connection, and obtain a Cu-to-Cu connection with high ductility and thus high reliability and a wide rage of applications.

Compared with traditional technologies, the electric connection and the manufacturing method thereof according to the present invention can achieve a formation of a composite metal layer with solid solution phase and high ductility. Since there is no IMC, the reliability problem of Cu-to-Cu connection can be resolved. In addition, moderate processing temperature and pressure are adequate for forming this Cu-to-Cu interconnection, which may directly reflect on the costs of processes as well as materials compatibility. It has the potential for mass production.

The present invention has been described with preferred embodiments thereof and it is understood that many changes and modifications to the described embodiments can be carried out without departing from the scope and the spirit of the invention that is intended to be limited only by the appended claims.

What is claimed is:

1. An electric connection, comprising:
   a first Cu layer;
   a second Cu layer; and
   a composite metal layer disposed between the first Cu layer and the second Cu layer, wherein the first Cu layer and the second Cu layer are connected with the composite metal layer,
   wherein the composite metal layer consists essentially of: 0.01 wt. %≤Ga≤20 wt. %; 0.01 wt. %≤Cu≤50 wt. %; and 30 wt. %≤Ni≤99.98 wt. %, and
   wherein the composite metal layer comprises no intermetallic compound, and the composite metal layer has a face-centered cubic crystal structure.

2. The electric connection according to claim 1, wherein the composite metal layer comprises 0.01 wt. % to 10 wt. % of Ga, 0.01 wt. % to 10 wt. % of Cu, and 80 wt. % to 99.98 wt. % of Ni.

* * * * *